United States Patent
Araki et al.

(10) Patent No.: US 6,225,399 B1
(45) Date of Patent: *May 1, 2001

(54) RESIN COMPOSITION, MOLDED ARTICLE PRODUCED FROM SAME AND METHOD FOR PRODUCING MOLDED ARTICLE

(75) Inventors: Takayuki Araki; Masahiro Kumegawa; Tsuyoshi Miyamori; Masami Kato; Masaji Komori; Taketo Kato; Tetsuo Shimizu, all of Settsu (JP)

(73) Assignee: Daikin Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,032

(22) PCT Filed: Oct. 25, 1996

(86) PCT No.: PCT/JP96/03135

§ 371 Date: Apr. 27, 1998

§ 102(e) Date: Apr. 27, 1998

(87) PCT Pub. No.: WO97/15623

PCT Pub. Date: May 1, 1997

(30) Foreign Application Priority Data

Oct. 27, 1995 (JP) .................................................... 7-280963

(51) Int. Cl.$^7$ ...................................................... C08F 8/00
(52) U.S. Cl. .................. 524/544; 526/249; 526/245; 526/247; 526/250; 526/255; 528/502
(58) Field of Search ...................................... 524/544, 526; 528/502

(56) References Cited

U.S. PATENT DOCUMENTS

| | | | |
|---|---|---|---|
| 4,341,685 | * | 7/1982 | Miyake et al. ........................ 524/544 |
| 5,030,684 | * | 7/1991 | Rauch-Puntiqam et al. ......... 524/544 |
| 5,155,173 | * | 10/1992 | Miura et al. ........................... 524/544 |
| 5,439,896 | * | 8/1995 | Ito et al. ................................ 524/544 |

FOREIGN PATENT DOCUMENTS

| | | |
|---|---|---|
| 42 20 411 A1 | 12/1993 | (DE) . |
| 0 147 594 A1 | 7/1985 | (EP) . |
| 0 445 523 A2 | 9/1991 | (EP) . |
| 866417 * | 4/1961 | (GB) ................................ 524/544 |
| 1072615 | 6/1967 | (GB) . |
| 53-134786 * | 11/1978 | (JP) .................................. 524/544 |
| 53-134787 * | 11/1978 | (JP) .................................. 524/544 |
| 61-95078 * | 5/1986 | (JP) .................................. 524/544 |
| 1-138255 * | 5/1989 | (JP) .................................. 524/544 |

\* cited by examiner

*Primary Examiner*—Bernard Lipman
(74) *Attorney, Agent, or Firm*—Kubovcik & Kubovcik

(57) ABSTRACT

A resin composition which gives a molded article having both of excellent mechanical properties and abrasion resistance with maintaining excellent thermal resistance, chemical resistance, surface characteristics (non-sticking property, low friction property), electric insulating property, etc. of a fluorine-containing polymer; a molded article obtained from the resin composition; and a method for producing the molded article are provided. The resin composition comprises:

(A-1) a fluorine-containing ethylenic polymer prepared by copolymerizing at least one of fluorine-containing monomers having any one of hydroxyl, carboxyl, a carboxylate salt group, a carboxylate ester group or epoxy in an amount of 0.05 to 30% by mole on the basis of the total amount of monomers, and (B-1) an inorganic filler or a non-meltable organic filler, wherein said resin composition comprises 1 to 99.5% by weight of the component (A-1) and 0.5 to 99% by weight of the component (B-1).

16 Claims, 1 Drawing Sheet

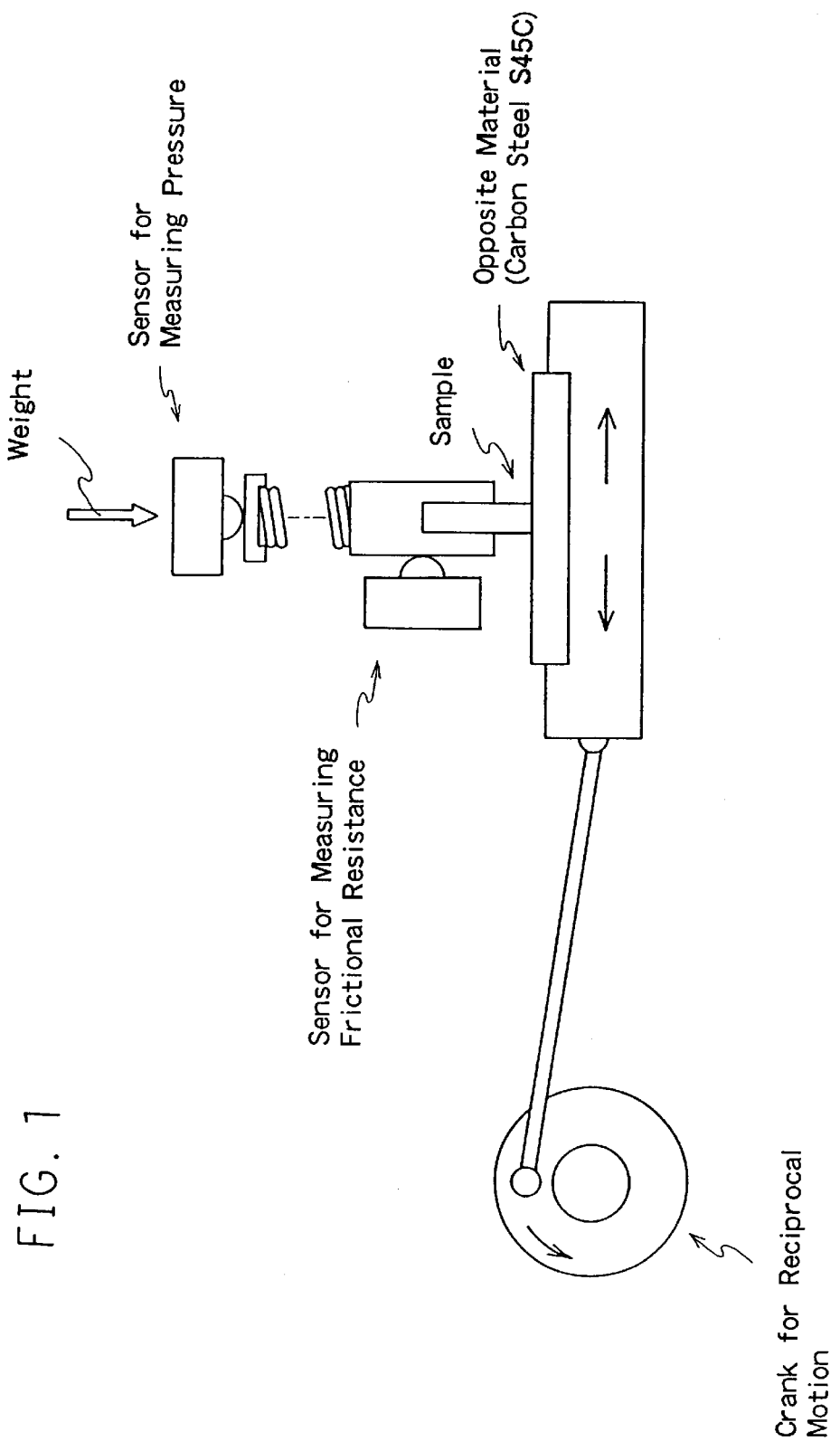

RESIN COMPOSITION, MOLDED ARTICLE PRODUCED FROM SAME AND METHOD FOR PRODUCING MOLDED ARTICLE

TECHNICAL FIELD

The present invention relates to a novel resin composition comprising a specific fluorine-containing ethylenic polymer having a functional group and a filler, particularly relates to a resin composition which is prepared by mixing a fluorine-containing ethylenic polymer having a functional group with an inorganic filler or a non-meltable organic filler and has improved mechanical characteristics and sliding property. The resin composition can be used suitably for various applications mentioned hereinbelow.

Further the present invention relates to a molded article which is obtained by heat-treating a molded article prepared from the above-mentioned resin composition and has further improved mechanical characteristics and sliding property. The present invention also relates to a method for producing the molded article.

BACKGROUND ART

In general a fluorine-containing resin inherently possesses thermal resistance, chemical resistance and low coefficient of friction, and for purposes to further improve mechanical characteristics and abrasion resistance, trials to add an inorganic or organic filler have been made.

However a fluorine-containing polymer itself has low surface energy and poor dispersibility when mixed with a filler, and the addition of the filler has insufficient effect on mechanical characteristics of the polymer. Also interfacial adhesion between the fluorine-containing polymer and the filler in the mixture is poor. For example, in case of use for a sliding material, the filler in a molded article is easily released from the sliding surface. Thus enough effect on abrasion resistance cannot be obtained and a sliding material having a long life has not been produced.

For the purpose to improve interfacial adhesion between the fluorine-containing resin and the filler, trials to admix a filler which is previously surface-treated with an organic compound have been made.

Various prior arts in which silane compounds are used as a surface-treating agent have been disclosed. For example, a hydrolyzable non-fluorine-containing siloxane compound having terminal amine group is used for surface-treating of glass fiber (U.S. Pat. No. 3,787,281), a silane coupling agent having methyl group bonded with silicon atom is used for surface-treating of a filler (JP-A-7-53780) and a fluorine-containing silane coupling agent such as:

is used (JP-A-4-272973).

Also there have been disclosed use of a fluorine-containing acid chloride for surface-treating of a glass fiber and carbon fiber (JP-A-4-345691), use of fluoropolyether having, at its molecular end, a functional group such as a siloxane group, alkoxy titanium group, epoxy group or isocyan group for surface-treating of a reinforcing material (JP-B-7-64973), etc.

Since those surface-treating agents basically differ from the fluorine-containing ethylenic polymer which is a matrix component from structural point of view, interfacial adhesion between the fluorine-containing polymer and the filler in the composition prepared by mixing the filler surface-treated by the mentioned methods or in the molded article is not enough, and the addition of such a filler does not have sufficient effect on mechanical characteristics and abrasion resistance of the molded article.

Also many of those surface-treating agents are generally insufficient in thermal resistance and chemical resistance, thus causing foaming and coloring due to decomposition of the surface-treating agent at the time of kneading and molding of the fluorine-containing resin and surface-treated filler. For example, in case of the uses for molded parts, which require thermal durability, among structural materials and sliding materials in the fields of automobiles, industrial machineries, OA apparatuses, domestic electric appliances, etc., there occurs elusion of the surface-treating agent or decomposed product thereof, which lowers initial characteristics (mechanical properties and abrasion resistance).

An object of the present invention is to solve the above-mentioned problems and to provide a resin composition which can give characteristics such as excellent mechanical properties and abrasion resistance to a molded article, while maintaining excellent thermal resistance, chemical resistance, surface characteristics (non-sticking property, low friction property), electrical insulating property and the like of the fluorine-containing polymer. Other objects are to provide a molded article produced from the resin composition and to provide a method for producing the molded article.

DISCLOSURE OF THE INVENTION

The present invention relates to a resin composition comprising:

(A-1) a fluorine-containing ethylenic polymer prepared by copolymerizing at least one of fluorine-containing ethylenic monomers having any one of hydroxyl, carboxyl, a carboxylate salt group, a carboxylate ester group or epoxy in an amount of 0.05 to 30% by mole on the basis of the total amount of monomers, and (B-1) an inorganic filler or a non-meltable organic filler; wherein said resin composition comprises 1 to 99.5% by weight of the component (A-1) and 0.5 to 99% by weight of the component (B-1).

It is preferable that the above-mentioned fluorine-containing ethylenic polymer (A-1) is a fluorine-containing ethylenic polymer having a crystalline melting point of not less than 120° C.

It is preferable that the above-mentioned fluorine-containing ethylenic polymer (A-1) is a fluorine-containing ethylenic polymer prepared by copolymerization of (a-1) 0.05 to 30% by mole of at least one of fluorine-containing ethylenic monomers having a functional group and represented by the formula (1):

(1)

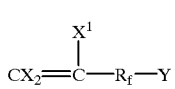

wherein Y is —CH$_2$OH, —COOH, a carboxylate salt group, a carboxylate ester group or epoxy, X and X$^1$ are the same or different and each is hydrogen atom or fluorine atom, R$_f$ is a divalent fluorine-containing alkylene group having 1 to 40 carbon atoms, a divalent fluorine-containing oxyalkylene group having 1 to 40 carbon atoms, a divalent fluorine-containing alkylene group having ether bond and 1 to 40 carbon atoms or a divalent fluorine-containing oxyalkylene group having ether bond and 1 to 40 carbon atoms, and (b-1) 70 to 99.95% by mole of at least one of ethylenic monomers copolymerizable with the component (a-1).

It is preferable that the above-mentioned fluorine-containing ethylenic monomer (a-1) having a functional group is a fluorine-containing monomer represented by the formula (2):

$$CH_2=CFCF_2-R_f^1-Y^1 \quad (2)$$

wherein $Y^1$ is —$CH_2OH$, —COOH, a carboxylate salt group, a carboxylate ester group or epoxy, $R_f^1$ is a divalent fluorine-containing alkylene group having 1 to 39 carbon atoms or —$OR_f^2$, in which $R_f^2$ is a divalent fluorine-containing alkylene group having 1 to 39 carbon atoms or a divalent fluorine-containing alkylene group having ether bond and 1 to 39 carbon atoms.

It is preferable that at least one of the above-mentioned ethylenic monomers (b-1) is a fluorine-containing ethylenic monomer.

It is preferable that the above-mentioned fluorine-containing ethylenic monomer (b-1) is tetrafluoroethylene.

It is preferable that the above-mentioned fluorine-containing ethylenic monomer (b-1) is a mixture of 85 to 99.7% by mole of tetrafluoroethylene and 0.3 to 15% by mole of a monomer represented by the formula (3):

$$CF_2=CF-R_f^2 \quad (3)$$

wherein $R_f^2$ is $CF_3$ or $OR_f^3$, in which $R_f^3$ is a perfluoroalkyl group having 1 to 5 carbon atoms.

It is preferable that the above-mentioned fluorine-containing ethylenic monomer (b-1) is a mixture of 40 to 80% by mole of tetrafluoroethylene or chlorotrifluoroethylene, 20 to 60% by mole of ethylene and 0 to 15% by mole of other monomer.

It is preferable that the above-mentioned filler (B-1) is a carbon fiber.

It is preferable that the above-mentioned filler (B-1) is a whisker.

It is preferable that the above-mentioned filler (B-1) is a glass filler.

It is preferable that the above-mentioned filler (B-1) is an inorganic filler having cleavage property.

It is preferable that the above-mentioned filler (B-1) is a non-meltable organic fiber.

It is preferable that the above-mentioned filler (B-1) is a carbon fiber.

It is preferable that the above-mentioned filler (B-1) is an aluminium borate whisker.

It is preferable that the above-mentioned filler (B-1) is a glass fiber.

It is preferable that the above-mentioned filler (B-1) is a molybdenum disulfide.

It is preferable that the above-mentioned filler (B-1) is a bronze.

It is preferable that the above-mentioned filler (B-1) is an aramide fiber.

Also the present invention relates to a resin composition comprising:

(A-2) a fluorine-containing ethylenic polymer prepared by copolymerizing at least one of fluorine-containing ethylenic monomers having any one of hydroxyl, carboxyl, a carboxylate salt group, a carboxylate ester group or epoxy in an amount of 0.05 to 30% by mole on the basis of the total amount of monomers, (B-2) an inorganic filler or a non-meltable organic filler, and (C) a fluorine-containing ethylenic polymer having no functional group in its branched chain, wherein an amount of the component (A-2) is from 1 to 50% by weight, an amount of the component (B-2) is from 0.5 to 80% by weight and an amount of the component (C) is the residual amount, provided that the sum of (A-2) and (C) is from 20 to 99.5% by weight and $(C)/((A-2)+(C)) \geqq 0.4$.

It is preferable that the above-mentioned fluorine-containing ethylenic polymer (C) having no functional group in its branched chain is a fluorine-containing ethylenic polymer having a crystalline melting point of not less than 120° C.

It is preferable that the above-mentioned fluorine-containing ethylenic polymer (C) having no functional group in its branched chain is polytetrafluoroethylene, tetrafluoroethyleneperfluoro(alkyl vinyl ether) copolymer, tetrafluoroethylene-hexafluoropropylene copolymer or ethylene-tetrafluoroethylene copolymer.

Also the present invention relates to a molded article produced by molding a resin composition comprising.

(A-3) a fluorine-containing ethylenic polymer which is prepared by copolymerizing at least one of fluorine-containing ethylenic monomers having any one of hydroxyl, carboxyl, a carboxylate salt group, a carboxylate ester group or epoxy in an amount of 0.05 to 30% by mole on the basis of the total amount of monomers and has a crystalline melting point of not less than 120° C., and (B-3) an inorganic filler or a non-meltable organic filler, wherein said resin composition comprises 1 to 99.5% by weight of the component (A-3) and 0.5 to 99% by weight of the component (B-3), and then heat-treating the obtained molded article at a temperature of not less than 100° C. and not more than the crystalline melting point of the fluorine-containing ethylenic polymer (A-3).

It is preferable that the above-mentioned fluorine-containing ethylenic polymer (A-3) is a fluorine-containing ethylenic polymer prepared by copolymerization of (a-2) 0.05 to 30% by mole of at least one of fluorine-containing ethylenic monomers having a functional group and represented by the formula (1):

(1)

wherein Y is —$CH_2OH$, —COOH, a carboxylate salt group, a carboxylate ester group or epoxy, X and $X^1$ are the same or different and each is hydrogen atom or fluorine atom, $R_f$ is a divalent fluorine-containing alkylene group having 1 to 40 carbon atoms, a divalent fluorine-containing oxyalkylene group having 1 to 40 carbon atoms, a divalent fluorine-containing alkylene group having ether bond and 1 to 40 carbon atoms or a divalent fluorine-containing oxyalkylene group having ether bond and 1 to 40 carbon atoms, and (b-2) 70 to 99.95% by mole of at least one of ethylenic monomers copolymerizable with the component (a-2).

It is preferable that at least one of the above-mentioned ethylenic monomers (b-2) is a fluorine-containing ethylenic monomer.

It is preferable that the above-mentioned fluorine-containing ethylenic monomer (b-2) is tetrafluoroethylene.

It is preferable that the above-mentioned fluorine-containing ethylenic monomer (b-2) is a mixture of 85 to 99.7% by mole of tetrafluoroethylene and 0.3 to 15% by mole of a monomer represented by the formula (3):

$$CF_2=CF-R_f^2 \qquad (3)$$

wherein $R_f^2$ is $-CF_3$ or $OR_f^3$, in which $R_f^3$ is a perfluoroalkyl group having 1 to 5 carbon atoms.

It is preferable that the above-mentioned fluorine-containing ethylenic monomer (b-2) is a mixture of 40 to 80% by mole of tetrafluoroethylene, 20 to 60% by mole of ethylene and 0 to 15% by mole of other monomer.

It is preferable that the above-mentioned filler (B-3) is a carbon fiber.

It is preferable that the above-mentioned filler (B-3) is a whisker.

It is preferable that the above-mentioned filler (B-3) is an aluminium borate whisker.

It is preferable that the above-mentioned filler (B-3) is a glass filler.

It is preferable that the above-mentioned filler (B-3) is an inorganic filler having cleavage property.

It is preferable that the above-mentioned filler (B-3) is a non-meltable organic fiber.

Further the present invention relates to a method for producing the above-mentioned molded article, characterized in that a molded article obtained by molding the above-mentioned resin composition is heat-treated at a temperature of not less than 100° C. and not more than a crystalline melting point of the fluorine-containing ethylenic polymer (A-1).

It is preferable that a molded article obtained by molding the above-mentioned resin composition is heat-treated at a temperature of not less than 200° C. and not more than the crystalline melting point of the fluorine-containing ethylenic polymer (A-1).

It is preferable that a molded article obtained by melting and molding the above-mentioned resin composition is heat-treated at a temperature of not less than 200° C. and not more than the crystalline melting point of the fluorine-containing ethylenic polymer (A-1).

BRIEF DESCRIPTION OF THE DRAWING

FIG. 1 is a diagrammatic view for explaining a Pin on Plate Type Abrasion Test Machine (Plate: Reciprocate) used for the abrasion test in the present invention.

BEST MODE FOR CARRYING OUT THE INVENTION

The fluorine-containing ethylenic polymer (A-1) having a functional group which is used for the resin composition of the present invention is a polymer prepared by copolymerizing at least one of fluorine-containing ethylenic monomers having any one of hydroxyl, carboxyl, a carboxylate salt group, a carboxylate ester group or epoxy in an amount of 0.05 to 30% by mole on the basis of the whole amount of monomer components.

The functional group of the fluorine-containing ethylenic polymer (A-1) having a functional group of the present invention is at least one of hydroxyl, carboxyl, a carboxylate salt group, a carboxylate ester group and epoxy, and is optionally selected depending on purpose, applying use and kind of the filler (B-1) in the composition. Particularly in case of the use for molded articles or molded parts which require thermal resistance at a high temperature, a fluorine-containing polymer having hydroxyl is preferable.

The fluorine-containing ethylenic polymer (A-1) used in the composition of the present invention can be selected from various ones in the form of a resin, elastomer and the like. When the composition is used for molding represented by sliding materials and molded parts, the fluorine-containing polymer (A-1) having a crystalline melting point of not less than 120° C. is preferred and one having a crystalline melting point of not less than 150° C. is more preferred.

The fluorine-containing ethylenic polymer used in the resin composition of the present invention is a fluorine-containing ethylenic polymer prepared by copolymerization of (a-1) 0.05 to 30% by mole of a fluorine-containing ethylenic monomer which has a functional group and is represented by the formula (1):

wherein X, $X^1$, $R_f$ and Y are the same as in the above-mentioned formula (1), and (b1) 70 to 99.95% by mole of an ethylenic monomer copolymerizable with the component (a-1).

Examples of the fluorine-containing ethylenic monomer (a-1) having a functional group are, for instance, one represented by the formula (4):

$$CF_2=CF-R_f^4-Y \qquad (4)$$

wherein Y is the same as in the formula (1), $R_f^4$ is a divalent fluorine-containing alkylene group having 1 to 40 carbon atoms or $-OR_f^5$, in which $R_f^5$ is a divalent fluorine-containing alkylene group having 1 to 40 carbon atoms or a divalent fluorine-containing alkylene group having ether bond and 1 to 40 carbon atoms, one represented by the formula (5):

$$CF_2=CFCF_2-OR_f^6-Y \qquad (5)$$

wherein Y is the same as in the formula (1), $-R_f^6$ is a divalent fluorine-containing alkylene group having 1 to 39 carbon atoms or a divalent fluorine-containing alkylene group having ether bond and 1 to 39 carbon atoms, one represented by the formula (6):

$$CH_2=CFCF_2-R_f^7-Y \qquad (6)$$

wherein Y is the same as in the formula (1), $-R_f^7$ is a divalent fluorine-containing alkylene group having 1 to 39 carbon atoms or $-OR_f^8$, in which $-R_f^8$ is a divalent fluorine-containing alkylene group having 1 to 39 carbon atoms or a divalent fluorine-containing alkylene group having ether bond and 1 to 39 carbon atoms, and one represented by the formula (7):

$$CH_2=CH-R_f^9-Y \qquad (7)$$

wherein Y is the same as in the formula (1), $R_2^9$ is a divalent fluorine-containing alkylene group having 1 to 40 carbon atoms.

The fluorine-containing ethylenic monomers (4) to (7) having a functional group are preferred because copolymerizability with the fluorine-containing ethylenic monomer (b-1) is relatively good and heat resistance of a polymer obtained by copolymerization is not lowered significantly. Among them, from the viewpoints of copolymerizability with other fluorine-containing ethylenic monomer and thermal resistance of the obtained polymer, the compounds represented by the formulae (4) and (6) are preferred, and the compound represented by the formula (6) is particularly preferred.

Examples of the fluorine-containing ethylenic monomer (4) having a functional group are:

$CF_2$=$CFOCF_2CF_2CH_2OH$,     $CF_2$=$CFO(CF_2)_3COOH$, $CF_2$=$CFOCF_2CF_2COOCH_3$, $CF_2$=$CFOCF_2CFOCF_2CF_2CH_2OH$     $CF_2$=$CFCF_2COOH$,
                |
                $CF_3$ $CF_2$=$CFCF_2CH_2OH$,     $CF_2$=$CFCF_2CF_2CH_2\overset{\displaystyle CHCH_2}{\underset{O}{\diagdown\diagup}}$ and the like.

Examples of the fluorine-containing ethylenic monomer (5) having a functional group are:

$CF_2$=$CFCF_2OCF_2CF_2CF_2COOH$, $CF_2$=$CFCF_2OCFCFCOOCH_3$
              |
              $CF_3$ and the like.

Examples of the fluorine-containing ethylenic monomer (6) having a functional group are:

$CH_2$=$CFCF_2CF_2CH_2CH_2OH$,     $CH_2$=$CFCF_2CF_2COOH$, $CH_2$=$CFCF_2CF_2CH_2\overset{\displaystyle CHCH_2}{\underset{O}{\diagdown\diagup}}$,     $CH_2$=$CF(CF_2CF_2)_2COOH$, $CH_2$=$CFCF_2OCFCH_2OH$,     $CH_2$=$CFCF_2OCFCOOH$,
              |                            |
              $CF_3$                       $CF_3$ $CH_2$=$CFCF_2OCFCH_2OCH_2\overset{\displaystyle CHCH_2}{\underset{O}{\diagdown\diagup}}$,
              |
              $CF_3$ $CH_2$=$CFCF_2OCFCF_2OCFCH_2OH$
              |      |
              $CF_3$  $CF_3$ and the like.

Examples of the fluorine-containing ethylenic monomer (7) having a functional group are:

$CH_2$=$CHCF_2CF_2CH_2CH_2COOH$, $CH_2$=$CH$—$(CF_2)_4$—$CH_2CH_2CH_2OH$, $CH_2$=$CH$—$(CF_2)_6$—$CH_2CH_2COOCH_3$ and the like.

Examples of the other fluorine-containing ethylenic monomer are:

$CH_2$=$CFCOOH$,     $CH_2$=$CHCH_2\overset{\displaystyle CF_3}{\underset{\displaystyle CF_3}{\overset{|}{\underset{|}{C}}}}$—$OH$ and the like.

The ethylenic monomer copolymerizable with the fluorine-containing ethylenic monomer (a-1) having a functional group can be selected optionally from known monomers. In order to give thermal resistance, chemical resistance and low friction property to a copolymer, it is preferable that such a copolymerizable ethylenic monomer is selected from ethylenic monomers having 1 to 5 carbon atoms among fluorine-containing ethylenic monomers and nonfluorine-containing ethylenic monomers.

Examples of the fluorine-containing ethylenic monomer are, for instance, tetrafluoroethylene, chlorotrifluoroethylene, vinyl fluoride, vinylidene fluoride, hexafluoropropylene, hexafluoroisobutene, $CH_2$=$CF$—$(CF_2)_n$—$X$,     $CH_2$=$CH$—$(CF_2)_n$—$X$ wherein both X are selected from H, Cl and F, both of n are an integer of 1 to 5, perfluoro(alkyl vinyl ethers) and the like.

Examples of the non-fluorine-containing ethylenic monomer are ethylene, propylene, 1-butene, 2-butene, vinyl chloride, vinylidene chloride and the like.

From the viewpoints of thermal resistance, chemical resistance and low friction property, it is preferable that at least one of the monomers (b-1) is the fluorine-containing monomer among the above-mentioned monomers.

Content of the functional group of the fluorine-containing ethylenic polymer in the resin composition of the present invention is from 0.05 to 30% by mole based on the total amount of monomers in the polymer, and can be selected optionally depending on kind of the filler (B-1) in the composition, proportion of the components (A-1) and (B-1) and purpose of the composition. The content is preferably from 0.05 to 20% by mole, particularly preferably from 0.1 to 10% by mole.

When the content of the functional group is not more than 0.05% by mole, enough effects of dispersibility and interfacial adhesion between the fluorine-containing polymer (A-1) and the filler (B-1) in the composition is hardly obtained. When the content of the functional group is not less than 30% by mole, it lowers thermal resistance of the fluorine-containing polymer, resin composition and molded article produced from the composition, thereby causing easily coloring, or lowering of mechanical characteristics.

Examples of the preferred fluorine-containing ethylenic polymer (A-1) used in the resin composition of the present invention are:

a copolymer comprising 0.05 to 30% by mole of the fluorine-containing ethylenic monomer (a-1) having a functional group and 70 to 99.95% by mole of tetrafluoroethylene (so-called functional group-containing polytetrafluoroethylene (functional group-containing PTFE));

a copolymer comprising 0.05 to 30% by mole of the fluorine-containing ethylenic monomer (a-1) on the basis of the total amount of monomers and further, based on the total amount of monomers except the monomer (a-1), 85 to 99.7% by mole of tetrafluoroethylene and 0.3 to 15% by mole of the monomer represented by the formula (3):

$$CF_2=CF-R_f^2 \tag{3}$$

wherein $R_f^2$ is selected from —$CF_3$ and $OR_f^3$, in which $R_f^3$ is a perfluoroalkyl group having 1 to 5 carbon atoms (functional group-containing tetrafluoroethylene-perfluoro(alkyl vinyl ether) copolymer (functional group-containing PFA) or functional group-containing tetrafluoroethylene-hexafluoropropylene copolymer (functional group-containing FEP));

a copolymer comprising 0.05 to 30% by mole of the fluorine-containing ethylenic monomer (a-1) based on the total amount of monomers and further, based on the total amount of monomers except the monomer (a-1), 40 to 80% by mole of tetrafluoroethylene or chlorotrifluoroethylene, 20 to 60% by mole of ethylene and 0 to 15% by mole of other copolymerizable monomer (functional group-containing ethylene-tetrafluoroethylene copolymer (functional group-containing ETFE) or functional group-containing ethylene-chlorotrifluoroethylene copolymer (functional group-containing ECTFE)); and the like.

Examples of the other copolymerizable monomer which has a functional group and is used for copolymerization of ethylene with tetrafluoroethylene or chlorotrifluoroethylene are, for instance, hexafluoropropylene, hexafluoroisobutene,

wherein X is H, Cl or F, n is an integer of 1 to 5, perfluoro(alkyl vinyl ethers), and the like.

Those exemplified fluorine-containing ethylenic polymers are excellent particularly in thermal resistance, chemical resistance, mechanical characteristics and low friction property among fluorine-containing polymers, and are particularly suitable for heat-resisting sliding materials when used for preparing a composition in combination use with the filler (b-1).

The inorganic filler or the non-meltable organic filler which is used as the filler (B-1) in the resin composition of the present invention is thermally stable, and is not decomposed and not melted at a processing temperature of general fluorine-containing polymers. The filler, when mixed to the composition, can give mechanical characteristics, abrasion resistance and other functions to a molded article.

Examples of the inorganic filler are, for instance, metals and metal fibers represented by stainless steel, iron, nickel, lead, copper, gold, silver, aluminium, molybdenum, rare earth cobalt and boron fiber; carbons represented by carbon black, graphite, carbon fiber, activated carbon, spherical hollow carbon and coke; oxides represented by silica, alumina, titanium oxide, iron oxide, zinc oxide, magnesium oxide, tin oxide, antimony oxide, etc.; hydroxides such as aluminium hydroxide and magnesium hydroxide; carbonates such as calcium carbonate, magnesium carbonate and zinc carbonate; sulfates such as calcium sulfate, gypsum fiber, barium sulfate, magnesium sulfate and MOS (fibrous basic magnesium sulfate); silicates represented by glass, spherical hollow glass, glass fiber, talc, mica, kaolin, calcium silicate, wollastonite, xonotlite, PMF (which is a mixture of alumino calcium silicate and MgO and is a kind of slag fiber), etc.; borates such as aluminium borate, magnesium borate and calcium borate; titanates such as potassium titanate and barium titanate; nitrates such as aluminium nitrate and silicon nitrate; carbides such as silicon carbide and titanium carbide; sulfides such as molybdenum disulfide, molybdenum trisulfide, tungsten disulfide, zinc sulfide and cadmium sulfide; phosphates such as calcium phosphate and iron phosphate; ferrites such as barium ferrite, calcium ferrite and strontium ferrite; and the like.

Those inorganic fillers are in the form of fiber, whisker, needle, powder, granule, bead, or the like.

The above-mentioned non-meltable organic filler is an organic substance except fluorine-containing polymers, has high heat resistance and is not decomposed and not melted at a temperature when the resin composition of the present invention is prepared or when the resin composition is molded to a molded article. The filler can give mechanical characteristics, abrasion resistance and other functions to the molded article.

The above-mentioned organic filler is an organic substance particularly having a melting point of not less than 400° C. or having a decomposition temperature of not less than 400° C. in case where it is non-meltable. Examples of the organic filler are organic fibers such as aramide fiber, polyarylate fiber and phenol fiber, thermosetting resins such as polyimide and COPNA resin, and the like.

In the composition of the present invention, kinds (materials, forms) of the filler can be selected, as the case demands, depending on kinds of desired functions and applications of the composition and molded articles produced therefrom.

Among the above-mentioned fillers, preferable are carbon fibers which can significantly improve mechanical characteristics (particularly strength, modulus), dimensional stability and abrasion resistance and give functions such as electric conductivity; glass fillers which maintain insulating property and enable significant improvement of mechanical properties, dimensional stability and abrasion resistance; whiskers which maintain flexibility and sealing property of fluorine-containing resins, give surface smoothness to molded articles and enable improvement of mechanical strength, dimensional stability and abrasion resistance; inorganic fillers which have self-lubricating property and cleavage property and give lubricity to compositions and molded articles to lower friction coefficient; and organic fibers which have low hardness and thus, when used for compositions for sliding parts, have characteristic of less injuring an opposite material (soft metal, etc.) on the contact surface and give mechanical properties, dimensional stability and abrasion resistance to molded articles.

Examples of the above-mentioned glass filler are, for instance, glass fiber, glass bead, glass powder, spherical hollow glass, etc. From the viewpoints of improvement of mechanical properties and abrasion resistance, the glass fiber is particularly preferable.

Whiskers are monocrystalline substances in the form of needle, and specifically a monocrystal having a section of not more than $8\times10^{-5}$ square inches and a length of not less than 10 times of an average diameter of the section, thus being distinctive from polycrystal continuous fibers.

Examples of the whisker are, for instance, silicon carbide whisker, silicon nitride whisker, potassium titanate whisker, aluminium borate whisker, zinc oxide whisker, basic magnesium sulfate whisker, graphite whisker, magnesium oxide whisker, magnesium borate whisker, titanium diboride whisker, calcium sulfate whisker and the like.

In the present invention, the filler having cleavage property means a filler having self-lubricating property and being capable of endowing lubricity to molded articles. Examples of the filler having cleavage property are lamellar crystalline substances such as graphite, molybdenum disulfide, tungsten disulfide, boron nitride having hexagonal crystal form, talc and mica. Preferable are graphite and molybdenum disulfide.

Examples of the organic fiber are aramide fiber, polyarylate fiber, phenol fiber and the like. Among them, preferable is aramide fiber.

The first resin composition of the present invention is a composition comprising:

(A-1) a fluorine-containing ethylenic polymer which is prepared by copolymerizing at least one of fluorine-containing ethylenic monomers having any one of hydroxyl, carboxyl, a carboxylate salt group, a carboxylate ester group or epoxy, in an amount of 0.05 to 30% by mole on the basis of the total amount of monomers, and (B-1) an inorganic filler or a non-meltable organic filler.

In the resin composition of the present invention comprising the two components (A-1) and (B-1), the same fluorine-containing ethylenic polymer having a functional group as mentioned above can be used as the fluorine-containing ethylenic polymer (A-1). Content of the functional group of the fluorine-containing ethylenic polymer (A-1) is from 0.05 to 30% by mole, preferably from 0.1 to 10% by mole, particularly preferably from 0.1 to 5% by mole on the basis of the whole monomers used in the fluorine-containing ethylenic polymer (A-1).

When the content of the functional groups is too low, effect on dispersibility and affinity between the fluorine-containing ethylenic polymer (A-1) and the filler (B-1) is not exhibited sufficiently. When the content of the functional group is too high, it lowers thermal resistance and mechanical properties.

In the resin composition of the present invention comprising the two components (A-1) and (B-1), the same inorganic or organic filler mentioned above can be used as the filler (B-1).

In addition to the above two essential components (A-1) and (B-1), other components may be added. In order to enhance mechanical properties and abrasion resistance without lowering excellent thermal resistance, chemical resistance and low friction property of the fluorine-containing polymer, it is preferable that the resin composition consists essentially of the two components (A-1) and (B-1).

The amounts of (A-1) and (B-1) of the resin composition of the present invention consisting of the two components are 1 to 99.5% by weight and 0.5 to 99% by weight, respectively. In case of the composition consisting essentially of the two components, a proportion represented by % by volume (vol %) is from 20 to 99.5 vol % for (A-1) and 0.5 to 80 vol % for (B-1), preferably from 40 to 99 vol % for (A-1) and from 1 to 60 vol % for (B-1), particularly preferably from 50 to 98 vol % for (A-1) and from 2 to 50 vol % for (B-1).

The resin composition of the present invention consisting of the two components can be used for various purposes and applications. Particularly in case of uses for sliding materials which require thermal resistance, examples of the preferred resin composition are those mentioned below.

i) A resin composition prepared by mixing:
(A-1) 60 to 95% by weight of at least one selected from the fluorine-containing polymer of claim 6 (functional group-containing PTFE), fluorine-containing polymer of claim 7 (functional group-containing FEP or PFA) and fluorine-containing polymer of claim 8 (functional group-containing ETFE), and
(B-1) 5 to 40% by weight of a carbon fiber.

The resin composition is preferable in that it has greatly improved mechanical properties and abrasion resistance, and that electric conductivity can be given to the composition ii ) A resin composition prepared by mixing:
(A-1) 60 to 95% by weight of at least one selected from the polymer of claim 6 (functional group-containing PTFE), fluorine-containing polymer of claim 7 (functional group-containing FEP or PFA) and fluorine-containing polymer of claim 8 (functional group-containing ETFE), and
(B-1) 5 to 40% by weight of a glass fiber.

The resin composition is preferable in that mechanical properties and abrasion resistance can be greatly improved, with maintaining electric insulating property, and that the filler itself is inexpensive and economically advantageous.

iii) A resin composition prepared by mixing:
(A-1) 70 to 98% by weight of at least one selected from the polymer of claim 7 (functional group-containing FEP or PFA) and polymer of claim 8 (functional group-containing ETFE), and
(B-1) 2 to 30% by weight of an aluminium borate whisker.

The resin composition is preferable as sliding materials being excellent in sealing property, maintaining flexibility of the fluorine-containing resin and surface smoothness of molded articles.

iv) A resin composition prepared by mixing:
(A-1) 70 to 98% by weight of at least one selected from the polymer of claim 6 (functional group-containing PTFE), polymer of claim 7 (functional group-containing FEP or PFA) and polymer of claim 8 (functional group-containing ETFE), and
(B-1) 2 to 30% by weight of a molybdenum disulfide.

The resin composition is preferable in that it can give self-lubricating property to molded articles and further lower surface friction coefficient.

v) A resin composition prepared by mixing:
(A-1) 40 to 95% by weight of at least one selected from the polymer of claim 6 (functional group-containing PTFE), polymer of claim 7 (functional group-containing FEP or PFA) and polymer of claim 8 (functional group-containing ETFE), and
(B-1) 5 to 60% by weight of a bronze.

The resin composition is preferable in that it can give self-lubricating property and surface smoothness to molded articles and lower surface friction coefficient stably.

vi) A resin composition prepared by mixing:
(A-1) 60 to 95% by weight of at least one selected from the polymer of claim 7 (functional group-containing FEP or PFA) and polymer of claim 8 (functional group-containing ETFE), and
(B-1) 5 to 40% by weight of an aramide fiber.

The resin composition is preferable in that it enhances mechanical properties and abrasion resistance and particularly that when used for sliding materials which contact with a soft metal as an opposite material, it hardly injures the opposite material.

Those resin compositions exemplified as i) to vi) have active sites such as OH group on the surface of the filler (B-1) therein, which has good reactivity and affinity with a functional group of the fluorine-containing ethylenic polymer (A-1) in the resin composition of the present invention. Thus more excellent mechanical properties and abrasion resistance can be given to molded articles obtained from the composition.

The second resin composition of the present invention is a resin composition comprising:
(A-2) a fluorine-containing ethylenic polymer prepared by copolymerizing a fluorine-containing ethylenic monomer having any one of hydroxyl, carboxyl, a carboxylate salt group, a carboxylate ester group or epoxy, in an amount of 0.05 to 30% by mole on the basis of the total amount of monomers,
(B-2) an inorganic filler or a non-meltable organic filler, and
(C) a fluorine-containing ethylenic polymer having no functional group in its branched chain.

Namely the resin composition comprising the three components (A-2), (B-2) and (C) is a composition, in which the fluorine-containing ethylenic polymer (A-2) having a functional group in the composition adheres to and becomes compatible with the filler (B-2) to modify surface characteristics of the filler (B-2), thus improving interfacial affinity and dispersibility between general fluorine-containing ethylenic polymer (C) having no functional group and the filler. Therefore good mechanical properties and abrasion resistance can be given to molded articles.

In the resin composition of the present invention comprising the three components, the above-mentioned fluorine-containing ethylenic polymer having a functional group can be used as the fluorine-containing ethylenic polymer (A-2) having a functional group. Content of the functional group is from 0.05 to 30% by mole, preferably from 0.1 to 10% by mole on the basis of the whole monomers of (A-2). When the content of the functional group is too low, enough effect on dispersibility and affinity between the fluorine-containing ethylenic polymer (C) and the filler (B-2) is not exhibited.

In the resin composition of the present invention comprising the three components, the above-mentioned inorganic or organic filler can be used as the filler (B-2).

In the resin composition of the present invention comprising the three components, the fluorine-containing ethylenic polymer (C) having no functional group excludes a fluorine-containing polymer which has a functional group introduced intentionally into its branched chain, but includes a fluorine-containing polymer which has a functional group (for example, —COF, —CH$_2$OH, etc. at a molecular end of PFA) produced at its molecular end by usual polymerization method of a fluorine-containing polymer.

The fluorine-containing ethylenic polymer (C) is selected from the above-mentioned various ones depending on purpose and application of the composition. When used for molding represented by sliding materials and molded parts, it is preferable that the polymer (C) is a resin-like fluorine-containing ethylenic polymer having a crystalline melting point of not less than 120° C., more preferably not less than 150° C.

Among them, particularly preferable are PTFE, PFA, FEP and ETFE having excellent thermal resistance, chemical resistance and low friction property and being capable of giving the same characteristics to the composition.

The resin composition of the present invention comprising the three essential components consists of (A-2), (B-2) and (C). Though other components can be added to the composition, it is desirable that the resin composition consists essentially of the three components (A-2), (B-2) and (C) in order to enhance mechanical properties and abrasion resistance without lowering excellent thermal resistance, chemical resistance and low friction property of the fluorine-containing ethylenic polymer.

In the resin composition of the present invention consisting of the three components, preferable proportion of (A-2), (B-2) and (C) is such that (A-2) is from 1 to 50% by weight, (B-2) is from 0.5 to 80% by weight and (C) is the residual amount, provided that a sum of (A-2) and (C) is from 20 to 99.5% by weight and (C)/((A-2)+(C))≧0.4. More preferably, (A-2) is from 1 to 40% by weight, (B-2) is from 2 to 70% by weight and (C) is the residual amount, provided that a sum of (A-2) and (C) is from 30 to 98% by weight and (C)/((A-2)+(C))≧0.5.

When the filler (B-2) is not more than 2% by weight, effects on mechanical properties and abrasion resistance become insufficient. When the sum of (A-2) and (C) decreases below 30% by weight, chemical resistance and low friction property of the resin composition cannot be exhibited sufficiently.

In the resin composition of the present invention comprising the three components, the fluorine-containing ethylenic polymer (A-2) having a functional group in the composition preferably has a structure sufficiently compatible with the fluorine-containing ethylenic polymer (C) having no functional group from the viewpoints of affinity and dispersibility of each component.

For example, most preferable compositions comprising the three components are:
a composition comprising
 (A-2) a fluorine-containing ethylenic polymer of claim 6 or 7 (functional group-containing PTFE, FEP or PFA),
 (B-2) a filler, and
 (C) PTFE;
a composition comprising
 (A-2) a fluorine-containing ethylenic polymer of claim 7 (functional group-containing PFA or FEP),
 (B-2) a filler, and
 (C) PFA or FEP;
a composition comprising
 (A-2) a fluorine-containing ethylenic polymer of claim 8 (functional group-containing ETFE),
 (B-2) a filler, and
 (C) ETFE;
and the like.

In the resin composition of the present invention, the composition comprising the two components of the fluorine-containing ethylenic polymer (A-1) having a functional group and the filler (B-1) or the composition comprising the three components (A-2), (B-2) and the fluorine-containing ethylenic polymer (C) having no functional group may be prepared by usual method of mixing PTFE containing a filler, for example, in case of a composition comprising PTFE or PTFE copolymer as a main component. The composition can be prepared by using a mixing machine, for example, a tumbler mixer and Henschel mixer, and is used as a molding material for compression molding, etc. In case of a composition comprising a melt-processable fluorine-containing polymer as a main component, it is prepared preferably by melt-mixing. Examples of the melt-mixing machine are mixing rolls, Banbury mixer, Brabender mixer, extruder, etc. Among them, the extruder is preferable in that its kneading power is large and improvement of dispersibility with the filler at blending can be expected more and that productivity at preparing a composition is good. As the extruder, there can be employed those having one screw or two or more screws. Particularly two-screw extruder is preferable in that since its kneading power is larger, a composition having good dispersibility can be obtained and that the kneading power can be regulated freely.

The composition is in general formed into pellets by the above-mentioned melt-mixing, and is used as a molding material for injection molding or injection molding.

The second invention relates to a molded article produced by molding a composition comprising:
 (A-3) 1 to 99.5% by weight of a fluorine-containing ethylenic polymer having a crystalline melting point of not less than 120° C. and prepared by copolymerizing at least one fluorine-containing ethylenic monomer having any one of hydroxyl, carboxyl, a carboxylate salt group, a carboxylate ester group or epoxy, in an amount of 0.05 to 30% by mole on the basis of the total amount of monomers, and (B-3) 0.5 to 99% by weight of an inorganic filler or a non-meltable organic filler, and then heat-treating the obtained molded article at a temperature of not less than 100° C. and not more than a crystalline melting point of the fluorine-containing ethylenic polymer (A-3).

Namely the molded article of the present invention is obtained by molding the above-mentioned resin composition of the present invention to any shape by usual molding method and then heat-treating the obtained molded article at a temperature of not less than 100° C. and not more than a crystalline melting point of the fluorine-containing ethylenic polymer.

Accordingly for the non-heat-treated molded article which is used to produce the heat-treated molded article of the present invention, there is used the fluorine-containing ethylenic polymer (A-1) having a functional group and a crystalline melting point of not less than 120° C. among the above-mentioned polymers (A-1) in the resin composition of the present invention.

Examples of the preferred polymer are the functional group-containing PTFE (polymer of claim 6), the functional group-containing PFA or FEP (polymer of claim 7) or the functional group-containing ETFE (polymer of claim 8) in that those polymers have excellent thermal resistance, chemical resistance, mechanical properties and low friction property and further that mechanical properties and abrasion resistance can be improved effectively by heat-treating the molded article obtained from the composition prepared by using the polymers and filler.

In the not-heat-treated molded article which is used to produce the heat-treated molded article of the present invention, there is used the same filler (B-3) as used in the above-mentioned resin composition of the present invention.

Examples of the preferred filler are carbon fibers, whiskers, glass fillers, inorganic fillers having cleavage property and non-meltable organic fillers.

Among them, preferable are carbon fibers, aluminium borate whiskers, glass fibers, molybdenum disulfide and aramide fibers.

The above-mentioned resin composition of the present invention is a composition comprising the fluorine-containing ethylenic polymer (A-1) having a functional group and the filler (B-1). The functional group of (A-1) functions effectively to improve adhesion, interfacial affinity and dispersibility between the polymer (A-1) and the filler (B-1).

Further with respect to the heat-treated molded article of the present invention obtainable by molding the resin composition of the present invention and then heat-treating the obtained molded article, following effects can be obtained by the heat-treatment.

1. The heat-treatment further accelerates the reaction and adsorption between the fluorine-containing ethylenic polymer (A-3) having a functional group and the filler (B-3), and improves interfacial adhesion therebetween more. Thereby in the sliding test, releasing of the filler (B-3) from the sliding surface is inhibited and thus abrasion resistance can be improved more.

2. By the heat-treatment, the functional groups of the fluorine-containing ethylenic polymer (A-3) having a functional group in the molded article react with each other, thus causing self-crosslinking to make its molecular weight higher and as a result being able to enhance mechanical properties, thermal resistance, abrasion resistance and creep resistance of the heat-treated molded article.

The molded article of the present invention is endowed with effect of the above 1 or 2 or combined effect of them.

The third invention relates to a method of producing the heat-treated molded article, characterized in that a molded article obtained by molding the resin composition comprising the fluorine-containing ethylenic polymer (A-3) which has a functional group and a crystalline melting point of not less than 120° C. and the filler (B-3) and then heat-treating the obtained molded article at a temperature of not less than 100° C. and not more than the crystalline melting point of (A-3).

It is important that the not-heat-treated molded article which is produced by molding the resin composition comprising the fluorine-containing ethylenic polymer (A-3) having a functional group and the filler (B-3) through various usual mold-processing methods into a desired shape depending on purposes and applications is heat-treated at a temperature of not less than 100° C. and not more than the melting point of the polymer (A-3). By the heat-treatment, the obtained molded article can be endowed with further improved mechanical properties, thermal resistance and abrasion resistance.

When the heat-treating temperature is too low, sufficient improvements of mechanical properties, thermal resistance and abrasion resistance cannot be obtained. Also when the heat-treatment is carried out at a temperature of not less than the melting point of the polymer (A-3), the given shape of the molded article cannot be maintained at the time of heat-treatment. Also, when the heat-treating temperature is too high, there occurs thermal deterioration during a long-term heat-treatment.

It is preferable that the heat-treatment is carried out for not less than five hours. When the heat-treating time is too short, it is difficult to obtain sufficient effects of mechanical properties, heat resistance and abrasion resistance. The heat-treatment may be carried out in an inert gas such as nitrogen gas or in air.

In the present invention, the fluorine-containing polymers (A-3) which have a functional group and a crystalline melting point of not less than 120° C. are used as the fluorine-containing polymer in the molded article to be heat-treated. Among them, the polymer having a crystalline melting point of not less than 200° C. is preferable because thermal resistance thereof is good, the heat-treatment can be carried out at a higher temperature and enough effect of the heat-treatment is easily obtained.

Among the above-mentioned polymers, preferable are polymers being excellent particularly in thermal resistance, chemical resistance and low friction property such as the PTFE polymer having a functional group (polymer of claim 6), the PFA or FEP polymer having a functional group (polymer of claim 7) and the ETFE polymer having a functional group (polymer of claim 8). The heat-treating temperature when heat-treating those polymers is preferably a temperature of not less than 180° C. and not more than the crystalline melting point of the fluorine-containing ethylenic polymer, more preferably a temperature of not less than 200° C. and not more than the crystalline melting point of the fluorine-containing ethylenic polymer.

The molded article to be heat-treated which can be used for producing the heat-treated molded article of the present invention, can be formed into desired shapes by various molding methods, for example, compression molding, transfer molding, injection molding, etc. Also it is possible to produce a not-heat-treated molded article in the form of a film, rod, pipe or tube by extrusion molding, etc. Further a desired molded article to be heat-treated can be produced by cutting, etc. of the molded article obtained by the mentioned methods. Among the above-mentioned molding methods, the melt-molding method, particularly injection molding method is preferable because molded articles having various shapes can be obtained, precise molding can be carried out, productivity is good, automated production is possible and processing cost can be lowered.

Among the resin compositions of the present invention, the composition comprising the melt-processable fluorine-containing ethylenic polymer ((A), (C)) can be generally subjected to injection molding. On the contrary, it is in general difficult to carry out melt-processing of a composition comprising the PTFE polymer as a main component. For example, the resin composition comprising the PFA or FEP polymer having a functional group (polymer of claim 7) or the ETFE polymer having a functional group (described in claim 8) is melt-processable. Though the so-obtained molded articles to be heat-treated have good thermal resistance and abrasion resistance under usual conditions, they are softened eventually at a high temperature and thus deformed or destroyed on their friction surfaces as compared with the not-heat-treated molded article obtained from the composition comprising the PTFE polymer having a functional group (polymer of claim 6). By heat-treating the melt-processed molded article according to the method of the present invention, self-crosslinking occurs between the fluorine-containing ethylenic polymers in the molded article, to make the molecular weight of the polymer higher and raise a melt viscosity, which results in that the molded article can be endowed with good thermal resistance and abrasion resistance and that the molded article having a high limiting PV and a wide temperature range at use can be obtained.

Namely, when the resin composition comprising the PFA or FEP polymer having a functional group (polymer of claim 7) or the ETFE polymer having a functional group (polymer of claim 8) is used, melt-processing is possible at the time of molding. As a result of the heat-treatment of the obtained molded article, there can be obtained the heat-treated molded article having thermal resistance and abrasion resistance (particularly limiting PV) which are equal to those of the not-heat-treated molded article obtained by using the PTFE polymer.

The resin composition and the molded article obtained therefrom can be used as sliding materials because they have thermal resistance and low friction coefficient of the fluorine-containing polymer and are imparted with mechanical properties and abrasion resistance by adding the filler.

The resin composition and the molded article of the present invention can be used for parts for automobiles such as bearings, mechanical shaft seal, piston ring, segment ring, rider ring, V packing, sliding pad, oil seal, seal ring for automatic mission and piston ring for shock absorber; parts for office automation apparatuses, for example, a copying machine, printer and facsimile machine and computers for domestic use, such as a bearing for fixing part, separator, fixing roll, exit roll, transmission gear, gear for liner toner transfer roll and wire guide; sealing materials of a compressor for air conditioning equipments, for example, chip seal for scroll compressor, and others such as gears and bearings; bearings, packings and seals of pumps for industrial machineries; and sliding members for construction equipment, cargo-handling machine, food processing machine, agricultural machine, etc. For applications other than the above-mentioned applications for sliding, by making use of thermal resistance, electric insulating property and chemical resistance of the fluorine-containing polymer, the resin composition and molded article can also be used for electric and electronic parts requiring dimensional stability, thermal resistance and electrical properties, for example, connector chip, carrier, receptacle, printed circuit board and covering material for wire; parts for semi-conductors requiring chemical resistance, particularly a large size wafer basket which has been difficult to produce by using a fluorine-containing resin alone from the viewpoint of moldability and due to lack of strength; and materials and molded articles such as valve and chemical pump parts.

EXAMPLE

The present inventions are explained by means of Examples and Reference Examples, but are not limited to them.

Each test in Examples was carried out by the following methods.

(1) Tension test

Tension test was carried out at room temperature at a crosshead speed of 10 mm/min with Tensilon Universal Tester available from Orientec Corporation by using a type 5 dumbbell according to ASTM D638.

(2) Bending test

Bending test was carried out at room temperature at a bending speed of 2 mm/min with Tensilon Universal Tester available from Orientec Corporation according to JIS K-6911.

(3) Deflection temperature under load

Deflection temperature under load was measured in $N_2$ gas stream under conditions of 18.6 kgf/cm$^2$ of load and 2° C./min of temperature raising rate with a heat distortion tester available from Yasuda Seiki Seisakusho Ltd. according to JIS K7207.

(4) Friction and wear test by thrust

Suzuki-Matsubara Thrust Washer Tester which was available from Orientec Corporation was employed, and an aluminium die cast (ADC12) was used as an opposite material A test was carried out in air at room temperature at a speed of 42 m/min to measure a limiting PV.

The limiting PV was measured under those fixed conditions by increasing a load by 2.5 kg/cm$^2$ per every 1 km of sliding distance. A value just before abrasion progresses drastically is assumed to be a limiting PV.

(5) Pin on Plate Abrasion Test (Plate: Reciprocate)

Pin on Plate Type Abrasion Test Machine shown in FIG. 1 was employed, and a carbon steel (S45C) was used as an opposite material. Measurement was made upto 10,000 cycles without lubricant in air at room temperature at a weight of 10 kg (surface pressure: 50 kg/cm$^2$), a stroke of 5 cm and a speed of 200 cpm.

Reference Example 1

Synthesis of PFA Having a Functional Group

A 6-liter glass-lined autoclave equipped with a stirrer, valve, pressure gauge and thermometer was charged with 1,500 ml of deionized water, followed by replacing by nitrogen gas sufficiently to evacuate the autoclave, and thereafter 1,500 g of 1,2-dichloro-1,1,2,2-tetrafluoroethane (R-114) was added in the autoclave.

Then 5.0 g of perfluoro-(1,1,9,9-tetrahydro-2,5-bistrifluoromethyl-3,6-dioxa-8-nonenol) represented by:

(8)

130 g of perfluoro(propyl vinyl ether) (PPVE) and 180 g of methanol were introduced into the autoclave with pressurized nitrogen gas, and the temperature in the system was kept at 35° C.

Pressurized tetrafluoroethylene gas (TFE) was introduced into the system with stirring so that an inside pressure would become 8.0 kgf/cm$^2$G. Then 0.5 g of a 50% methanol solution of di-n-propyl peroxydicarbonate was added by using pressurized nitrogen gas to start the reaction.

Since the pressure in the system decreased with advance of the polymerization reaction, it was raised again to 8.0 kgf/cm$^2$ with the tetrafluoroethylene gas when it lowered down to 7.5 kgf/cm$^2$G. Thus lowering and raising of the inside pressure were repeated.

With continuing supply of tetrafluoroethylene, every time when about 60 g of the tetrafluoroethylene gas was consumed after the starting of the polymerization, 2.5 g of the above-mentioned fluorine-containing ethylenic monomer having hydroxyl (compound represented by the formula (4)) was introduced nine times under pressure (22.5 g in total) to continue the polymerization. At the time when about 600 g of the tetrafluoroethylene was consumed from the starting of the polymerization, the supplying thereof was stopped and the autoclave was cooled, followed by discharging of un-reacted monomer and R-114.

After washing the obtained copolymer with water and methanol, the copolymer was vacuum-dried to give 710 g of a white solid. A proportion of the obtained copolymer determined according to $^{19}$F-NMR analysis and IR analysis was TFE/PPVE/(Fluorine-containing ethylenic polymer having hydroxyl represented by the formula (8))=97.0/2.0/1.0% by mole. In the infrared spectrum, the specific absorption of —OH was observed at 3,620 to 3,400 cm$^{-1}$. According to DSC analysis, Tm was 305° C., and according to DTGA analysis, 1% thermal decomposition temperature Td was 375° C. A melt-flow-rate which was measured with Koka-type flow tester at 372° C. by preheating for five minutes by using a nozzle of 2 mm diameter and 8 mm length was 32 g/10 min.

Reference Example 2

Synthesis of PFA Having No Functional Group

Synthesis was carried out in the same manner as in Reference Example 1 except that perfluoro( 1,1,9,9-tetrahydro-2,5-bistrifluoromethyl-3,6-dioxa-8-nonenol) (compound represented by the formula (8)) was not used and that 240 g of methanol was used, to give 597 g of PFA having no functional group.

The obtained PFA was analyzed in the same manner as in Reference Example 1. The results are as follows.
TFE/PPVE=98.2/1.8% by mole
Tm=310° C.
Td=469° C.
Melt flow rate=24 g/10 min Example 1

Blending of Fluorine-Containing Ethylenic Polymer Having a Functional Group and Carbon Fiber After blending uniformly the functional group-containing PFA obtained in Reference Example 1 and a carbon fiber (Kureca Chop M-207S available from Kureha Chemical Industris, Ltd.) in a weight ratio of 80:20 with a rock-in-mixer, the mixture was kneaded at 350° to 370° C. with a twin screw extruder (Laboplastomill available from Toyo Seiki Co., Ltd.) and then extruded to give pellets. Those pellets were molded by using an injection molding machine (Minimat M26/15B available from Sumitomo Heavy Industries Ltd.) at a cylinder temperature of 360° to 390° C. and a die temperature of 200° C. to give a test piece.

The tension test, bending test, measurement of deflection temperature under load and friction and wear test by thrust were carried out by using the obtained test piece. The results are shown in Table 1.

Example 2

Heat-Treatment of Molded Article Comprising Fluorine-Containing Ethylenic Polymer Having a Functional Group and Carbon Fiber The test piece obtained in Example 1 was heat-treated at 280° C. for 24 hours in a forced convection oven.

With respect to the heat-treated molded article, the tests were carried out in the same manner as in Example 1. The results are shown in Table 1.

Comparative Example 1

Blending of PFA Having No Functional Group and Carbon Fiber

Kneading, extruding and molding were carried out in the same manner as in Example 1 except that PFA having no functional group of Reference Example 2 was used instead of the functional group-containing PFA obtained in Reference Example 1, to give a test piece. The tests were carried out in the same manner as in Example 1 by using the obtained test piece. The results are shown in Table 1.

TABLE 1

|  | Ex. 1 | Ex. 2 | Com. Ex. 1 |
| --- | --- | --- | --- |
| (Tension test) |  |  |  |
| Tensile strength (kgf/cm$^2$) | 377 | 399 | 363 |
| Tensile modulus (kgf/cm$^2$) | 23500 | 25900 | 22500 |
| Elongation (%) | 5.1 | 5.1 | 4.7 |
| (Bending test) |  |  |  |
| Bending strength (kgf/cm$^2$) | 616 | 652 | 585 |
| Bending modulus kgf/cm$^2$) | 35200 | 36100 | 35400 |
| Maximum deflection (%) | 5.1 | 5.5 | 4.8 |
| Deflection temperature under load (° C.) | 203.7 | 212.1 | 203.5 |
| (Frictional and wear test by thrust) Limiting PV (kg · m/cm$^2$ · min) | 735 | 945 | 735 |

Example 3

Blending of Fluorine-Containing Ethylenic Polymer Having a Functional Group and Aluminium Borate Whisker The functional group-containing PFA obtained in Reference Example 1 and aluminium borate whisker (Alborex Y available from Shikoku Chemical Industries, Ltd.) were blended uniformly in a weight ratio of 92:8 by using a rock-in mixer, and then the mixture was kneaded at 350° to 370° C. with a twin screw extruder (Laboplastomill available from Toyo Seiki Co., Ltd.) and extruded to give pellets.

Those pellets were molded at a cylinder temperature of 360° to 390° C. and a die temperature of 200° C. with an injection molding machine (Minimat M26/15B available from Sumitomo Heavy Industries Ltd.) to give a test piece. By using the obtained test piece, the tension test, bending test, measurement of deflection temperature under load and Pin on Plate Type Abrasion Test were carried out. The results are shown in Table 2.

Comparative Example 2

Blending of PFA Having No Functional Group and Aluminium Borate Whisker

Kneading, extruding and molding were carried out in the same manner as in Example 3 except that the PFA having no functional group of Reference Example 2 was used instead of the PFA having a functional group and obtained in Reference Example 2, to give a test piece. The tests were carried out in the same manner as in Example 3 by using the obtained test piece. The results are shown in Table 2.

Example 4

Heat-Treating of a Molded Article Comprising a Fluorine-Containing Ethylenic Polymer Having a Functional Group and Aluminium Borate Whisker The test piece obtained in Example 3 was heat-treated at 280° C. for 24 hours in a forced convection oven. The heat-treated molded article was subjected to testing in the same manner as in Example 3. The results are shown in Table 2.

TABLE 2

|  | Ex. 3 | Ex. 4 | Com. Ex. 2 |
|---|---|---|---|
| (Tension test) | | | |
| Tensile strength (kgf/cm$^2$) | 280 | 296 | 224 |
| Tensile modulus (kgf/cm$^2$) | 9500 | 11900 | 9500 |
| Elongation (%) | 25 | 28 | 25 |
| (Bending test) | | | |
| Bending strength (kgf/cm$^2$) | 287 | 307 | 263 |
| Bending modulus (kgf/cm$^2$) | 11800 | 13200 | 9900 |
| Maximum deflection (%) | 6.9 | 7.1 | 6.5 |
| Deflection temperature under load (° C.) | 92.8 | 103.7 | 84.3 |
| (Pin on Plate Type Abrasion Test (Reciprocate)) | | | |
| Frictional force (kgf)[1)] | 1.06 ⇒ 0.80 | 0.90 ⇒ 0.73 | 1.15 ⇒ 0.88 |
| Thickness of wear (μm) | 28 | 24 | 80 |

[1)]Values at 1000 ⇒ 10000 cycles

INDUSTRIAL APPLICABILITY

The present invention can provide a molded article having excellent mechanical properties and abrasion resistance, with maintaining characteristics such as thermal resistance, chemical resistance, surface properties (non-sticking property, low friction property) and electrical insulating property, a resin composition for production thereof; and a method for production of the molded article.

What is claimed is:

1. A molded article produced by molding a resin composition comprising:
    (A-3) a fluorine-containing ethylenic polymer which has a crystalline melting point of not less than 120° C. and is prepared by copolymerizing at least one of fluorine-containing ethylenic monomers having any one of hydroxyl, carboxyl, a carboxylate salt group, a carboxylate ester group or epoxy in an amount of 0.05 to 30% by mole on the basis of the total amount of monomers, and
    (B-3) an inorganic filler or a non-meltable organic filler, wherein said resin composition comprises 1 to 99.5% by weight of the component (A-3) and 0.5 to 99% by weight of the component (B-3),
    and then heat-treating the obtained molded article at a temperature of not less than 100° C. and not more than a crystalline melting point of the fluorine-containing ethylenic polymer (A-3).

2. The molded article of claim 1, wherein the fluorine-containing ethylenic polymer (A-3) is a fluorine-containing ethylenic polymer prepared by copolymerization of
    (a-2) 0.05 to 30% by mole of at least one of fluorine-containing ethylenic monomers having a functional group and represented by the formula (1):

(1)

wherein Y is —CH$_2$OH, —COOH, a carboxylate salt group, a carboxylate ester group or epoxy, X and X$^1$ are the same or different and each is hydrogen atom or fluorine atom, R$_f$ is a divalent fluorine-containing alkylene group having 1 to 40 carbon atoms, a divalent fluorine-containing oxyalkylene group having 1 to 40 carbon atoms, a divalent fluorine-containing alkylene group having ether bond and 1 to 40 carbon atoms or a divalent fluorine-containing oxyalkylene group having ether bond and 1 to 40 carbon atoms, with
    (b-2) 70 to 99.95% by mole of at least one of ethylenic monomers copolymerizable with the component (a-2).

3. The molded article of claim 2, wherein at least one of the ethylenic monomers (b-2) is a fluorine-containing ethylenic monomer.

4. The molded article of claim 3, wherein the fluorine-containing ethylenic monomer (b-2) is tetrafluoroethylene.

5. The molded article of claim 3, wherein the fluorine-containing ethylenic monomer (b-2) is a mixture of 85 to 99.7% by mole of tetrafluoroethylene and 0.3 to 15% by mole of a monomer represented by the formula (3):

(3)

wherein R$_f^2$ is —CF$_3$ or OR$_f^3$, in which R$_f^3$ is a perfluoroalkyl group having 1 to 5 carbon atoms.

6. The molded article of claim 3, wherein the fluorine-containing ethylenic monomer (b-2) is a mixture of 40 to 80% by mole of tetrafluoroethylene, 20 to 60% by mole of ethylene and 0 to 15% by mole of other monomer.

7. The molded article of claim 1, wherein the filler (B-3) is selected from the group consisting of a carbon fiber, a whisker, a glass filler, an inorganic filler having cleavage property and a non-meltable organic fiber.

8. The molded article of claim 7, wherein the whisker is an aluminium borate whisker.

9. A method for producing a molded article obtained by molding a resin composition comprising:
    (A-1) a fluorine-containing ethylenic polymer prepared by copolymerizing at least one of fluorine containing ethylenic monomers having any one of hydroxyl, carboxyl, a salt group of carboxylate, an ester group of carboxylate or epoxy in an amount of 0.05 to 30% by mole on the basis of the total amount of monomers, and (B-1) an inorganic filler or a non-meltable organic filler which is thermally stable and is not decomposed and not melted at a processing temperature of the fluorine-containing ethylenic polymer (A-1), and imparts mechanical strength and abrasion resistance to the molded article, wherein said resin composition comprises 1 to 99.5% by weight of the component (A-1) and 0.5 to 99% by weight of the component (B-1), and then heat-treating the molded article at a temperature of not less than 100° and not more than a crystalline melting point of the fluorine-containing ethylenic polymer (A-1).

10. The method for producing a molded article of claim 9, wherein the fluorine-containing ethylenic polymer (A-1) is a fluorine-containing ethylenic polymer repared by copolymerizing of (a-1) 0.05 to 30% by mole of at least one of fluorine-containing ethylenic monomers having a functional group and represented by the formula (1):

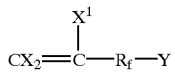         (1)

wherein Y is —CH$_2$, OH, —COOH, a salt group of carboxylate, an ester group of carboxylate or epoxy, X and X$^1$ are the same or different and each is hydrogen atom or fluorine atom, R$_f$ is a divalent fluorine-containing alkylene group having 1 to 40 carbon atoms, a divalent fluorine-containing oxyalkylene group having 1 to 40 carbon atoms, a divalent fluorine-containing alkylene group having ether bond and 1 to 40 carbon atoms or a divalent fluorine-containing oxyalkylene group having ether bond and 1 to 40 carbon atoms, and (b-1) 70 to 99.95% by mole of at least one of ethylenic monomers copolymerizable with the component (a-1).

11. The method for producing a molded article of claim 10, wherein the fluorine-containing ethylenic monomer (b-1) is tetrafluoroethylene and the molded article obtained by molding the resin composition is heat-treated at a temperature of not less than 200° C. and not more than a crystalline melting point of the fluorine-containing ethylenic polymer (A-1).

12. The method for producing a molded article of claim 10, wherein the fluorine-containing ethylenic monomer (b-1) is a mixture of 85 to 99.7% by mole of tetrafluoroethylene and 0.3 to 15% by mole of a monomer represented by the formula (3):

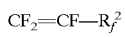         (3)

wherein R$_f^2$ is —CF$_3$ or OR$_3$, in which R$_f^3$ is a perfluoroalkyl group having 1 to 5 carbon atoms, and the molded article obtained by molding the resin composition is heat-treated at a temperature of not less than 200° C. and not more than a crystalline melting point of the fluorine-containing ethylenic polymer (A-1).

13. The method for producing a molded article of claim 10, wherein the fluorine-containing ethylenic monomer (b-1) is a mixture of 40 to 80% by mole of tetrafluoroethylene or chlorotrifluoroethylene and 20 to 60% by mole of ethylene and 0 to 15% by mole of other monomer, and the molded article obtained by molding the resin composition is heat-treated at a temperature of not less than 200° C. and not more than a crystalline melting point of the fluorine-containing ethylenic polymer (A-1).

14. The method for producing a molded article of claim 9, wherein the inorganic filler is a metallic filler, a carbon filler, an oxide filler, a hydroxide filler, a carbonate filler, a sulfate filler, a silicate filler, a borate filler, a nitrate filler, a carbide filler, a titanate filler or a mixture thereof.

15. The method for producing a molded article of claim 9, wherein the non-meltable organic filler is an organic substance having a melting temperature or decomposition temperature of not less than 400° C.

16. The method for producing a molded article of claim 9, wherein the filler is in the form of a fiber, whisker, needle, powder, granule, bead or a form having a cleavage property.

* * * * *

UNITED STATES PATENT AND TRADEMARK OFFICE
CERTIFICATE OF CORRECTION

PATENT NO. : 6,225,399 B1
DATED : May 1, 2001
INVENTOR(S) : Takayuki Araki et al.

It is certified that error appears in the above-identified patent and that said Letters Patent is hereby corrected as shown below:

<u>Title page,</u>
Item [56], References Cited, FOREIGN PATENT DOCUMENTS, insert:

| | | |
|---|---|---|
| 3-234753 A | 10/1991 | (JP) |
| 6-263951 A | 9/1994 | (JP) |
| 4-33904 A | 2/1992 | (JP) |
| 60-67517 A | 4/1985 | (JP) |
| 63-54409 A | 3/1988 | (JP) |
| 7-506602 A | 7/1995 | (JP) |
| 5-247304 A | 9/1993 | (JP) |
| 4-279639 A | 10/1992 | (JP) |
| 1-304142 A | 12/1989 | (JP) |
| 62-167344 A | 7/1987 | (JP) |
| 6-220249 A | 8/1994 | (JP) |

Signed and Sealed this

Twenty-ninth Day of January, 2002

Attest:

JAMES E. ROGAN
Attesting Officer  Director of the United States Patent and Trademark Office